United States Patent
Morishima

(10) Patent No.: US 7,541,622 B2
(45) Date of Patent: Jun. 2, 2009

(54) SUPER LUMINESCENT DIODE AND MANUFACTURING METHOD THEREOF

(75) Inventor: Yoshikatsu Morishima, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 143 days.

(21) Appl. No.: 11/634,882

(22) Filed: Dec. 7, 2006

(65) Prior Publication Data

US 2007/0126027 A1    Jun. 7, 2007

(30) Foreign Application Priority Data

Dec. 7, 2005  (JP)  ............................. 2005-353149
Jun. 26, 2006  (JP)  ............................. 2006-174999

(51) Int. Cl.
*H01L 33/00* (2006.01)

(52) U.S. Cl. ............................. 257/94; 257/79; 257/86; 438/22; 438/27; 356/511

(58) Field of Classification Search .................. 257/79, 257/86, 88, 94, 96; 438/22, 27, 31, 47; 356/511
See application file for complete search history.

(56) References Cited

U.S. PATENT DOCUMENTS 6,080,598 A * 6/2000 Kawai .......................... 438/33

2006/0007976 A1 * 1/2006 Watanabe et al. ........ 372/46.01
2007/0019208 A1 * 1/2007 Toida et al. ................. 356/511

FOREIGN PATENT DOCUMENTS

JP          5-243608 A        9/1993

OTHER PUBLICATIONS

F. Bugge, et al., "Interdiffusion in Highly Strained InGaAs-QWs for High Power Laser Diode Applications", J. Crystal Growth, vol. 272, Issues 1-4, pp. 531-537, 2004.

* cited by examiner

*Primary Examiner*—Phuc T Dang
(74) *Attorney, Agent, or Firm*—Sughrue Mion, PLLC

(57) ABSTRACT

To provide a superluminescent diode capable of emitting high output super luminescent light having a central wavelength within a range of 0.95 μm to 1.2 μm and an undistorted beam cross section, having a long element life. The super luminescent diode is constituted by: an n-type GaAs substrate; an optical waveguide path constituted by an InGaAs active layer that emits light having a central wavelength within a range of 0.95 μm to 1.2 μm, formed on the GaAs substrate; and a window region layer having a greater energy gap and a smaller refractive index than the active layer, constituted by p-type GaAs that lattice matches with the GaAs substrate, provided at a rear emitting facet of the optical waveguide path. The p-type GaAs window region layer has a favorable crystal membrane with the InGaAs active layer that emits light having the central wavelength within the range of 0.95 μm to 1.2 μm, which does not deteriorate.

4 Claims, 6 Drawing Sheets

SUPER LUMINESCENT DIODE AND MANUFACTURING METHOD THEREOF

BACKGROUND OF THE INVENTION

1. Field of the Invention

The present invention is related to a super luminescent diode that emits light having a central wavelength within a range of 0.95 µm to 1.2 µm. Particularly, the present invention is related to a super luminescent diode having a window region layer, and a manufacturing method thereof.

2. Description of the Related Art

Super luminescent diodes are semiconductor light emitting elements which are capable of emitting low coherence light having a wide band spectral shape, similar to light emitting diodes. Super luminescent diodes are also capable of emitting light having high directionality, up to several tens of mW, similar to semiconductor lasers. The basic structure of super luminescent diodes is similar to that of semiconductor lasers, except that a configuration that suppresses laser oscillation is adopted.

In order to suppress laser oscillation, it is necessary to suppress the reflectance at facets of super luminescent diodes. Known examples of means for suppressing reflectance include: (1) Anti Reflective (AR) films; (2) oblique optical waveguide path structures; (3) non-excitable facet structures; and (4) facet window structures. AR films are easy to generate, but have the drawbacks that laser oscillation occurs regardless of their provision, and that it is difficult to obtain high output when they are provided. The oblique optical waveguide path structures suppress oscillation by slightly inclining optical waveguide paths from optical waveguide facets. The oblique optical waveguide path structures are easy to generate, and is highly effective in suppressing laser oscillation. However, beam cross sections become distorted, and coupling efficiencies with optical fibers and the like deteriorate, because the emitting direction of light beams is inclined. The non-excitable facet structures suppress oscillation, by providing non-excitable layers that absorb light and suppress oscillation along optical waveguide paths. Although the non-excitable facet structures are easy to generate, there is a problem that heat is generated de to the light absorption, as the result of which element life is shortened.

The facet window structures suppress oscillation by providing window regions on facets which are not the light emitting facets optical waveguide paths by embedded growth, and diffusing light. Because embedded growth is necessary to form the window regions, difficulties in generation are increased. However, element properties are most favorable with the facet window structure. Note that it is necessary for the portion that corresponds to the window region to be embedded with a material that has a greater energy gap and a lower refractive index than the material than the material of an active layer. For example, the super luminescent diode having a GaAs substrate disclosed in Japanese Unexamined Patent Publication No. 5(1993)-243608 employs $Al_xGa_{1-x}As$ as the material of an active layer, and $Al_yGa_{1-y}As$ (x<y) as the material of the window region.

Recently, research of medical diagnosis and the like utilizing light is being advanced. It is known that low coherence light having a wide full width at half maximum spectrum is effective in optical diagnosis of living tissue. Particularly, low coherence light having a central wavelength within a range of 0.95 µm to 1.2 µm is not likely to be influenced by absorption by water, which is the main component of living tissue, and therefore is preferred as a low coherence light for optical diagnosis. Titanium sapphire lasers and the like are conventionally utilized as light sources that emit this type of low coherence light. However, many of these lasers are costly and difficult to handle.

Meanwhile, a super luminescent diode that emits low coherence light having a central wavelength within a range of 0.95 µm to 1.2 µm is known. However, this super luminescent diode is of the oblique optical waveguide path structure, and has a distorted beam cross section. Accordingly, this super luminescent diode is not suitable as a light source for optical diagnosis.

The present inventor focused on a super luminescent diode having a window structure at a facet of an optical waveguide path, as a super luminescent diode which is capable of emitting light having an undistorted beam cross section. However, a problem was discovered in that desirable element life is not obtainable with a super luminescent diode having a conventionally known structure.

SUMMARY OF THE INVENTION

The present invention has been developed in view of the foregoing problems. It is an object of the present invention to provide a super luminescent diode capable of emitting high output super luminescent light having a central wavelength within a range of 0.95 µm to 1.2 µm and an undistorted beam cross section, having a long element life. It is another object of the present invention to provide a manufacturing method for such a super luminescent diode.

The super luminescent diode of the present invention comprises:

a GaAs substrate having a first conductivity;

an optical waveguide path constituted by one of an InGaAs active layer and a GaInNAs active layer that emits light having a central wavelength within a range of 0.95 µm to 1.2 µm, formed on the GaAs substrate; and a window region layer having a greater energy gap and a smaller refractive index than the active layer and a second conductivity different from the first conductivity, constituted by a binary or ternary semiconductor material with a lattice coefficient that lattice matches with GaAs within a range of ±0.1% and does not contain Al, provided at a rear emitting facet of the optical waveguide path.

The semiconductor material of the window region layer may be either GaAs or InGaP.

The method for manufacturing super luminescent diodes of the present invention comprises:

forming an optical waveguide path constituted by one of an InGaAs active layer and a GaInNAs active layer that emits light having a central wavelength within a range of 0.95 µm to 1.2 µm, on a GaAs substrate having a first conductivity; and forming a window region layer having a greater energy gap and a smaller refractive index than the active layer and a second conductivity different from the first conductivity, constituted by a binary or ternary semiconductor material with a lattice coefficient that lattice matches with GaAs within a range of ±0.1% and does not contain Al, at a rear emitting facet of the optical waveguide path, wherein:

the manufacturing step following the formation of the active layer constituted by one of InGaAs and GaInNAs is performed in an environment at a temperature less than or equal to 650° C.

Conventionally, it is known that the semiconductor material of a window region layer, provided on a facet of an optical waveguide path of a super luminescent diode, must have a greater energy gap and a smaller refractive index than those of an active layer. For example, in the case that InGaAs or GaInNAs is employed as the material of the active layer, InGaAs having a lower In content than the active layer or AlGaAs may be employed as the material of the window region layer.

The present inventor discovered through experimentation that there are several other important conditions regarding the material of the window region layer, in addition to the aforementioned conventionally known requirement.

First, consider a case in which InGaAs or GaInNAs is employed as the material of an active layer in order to obtain super luminescent light having a central wavelength within a range of 0.95 μm to 1.2 μm. These materials deteriorate at temperatures exceeding 650° C. Therefore, it is preferable for manufacturing steps following formation of the active layer to be performed in an environment at temperatures of 650° C. or less. AlGaAs is frequently utilized as the material for windows, in super luminescent diodes having window structures as described above. However, it is known that it is preferable to form semiconductor layers containing Al at high temperatures. This is because oxygen is incorporated into the material when the atmospheric temperature is low (refer to F. Bugge et al., "Interdiffusion in Highly Strained InGaAs-QWs for High Power Laser Diode Applications", J. Crystal Growth, Vol. 272, Issues 1-4, pp. 531-537, 2004).

In experiments, window region layers were produced with materials that contain Al, for example, AlGaAs, at temperatures less than or equal to 650° C. In these cases, oxygen was incorporated into the window region layer, thereby increasing non-light emitting recombined centers. The increased non-light emitting recombined centers generate heat, thereby causing it to be difficult to obtain a desired element life.

Generally, active layers are approximately 100 Å thick, whereas it is necessary to grow films at least several hundreds of nm, to form window region layers. In experiments, films for window region layers were formed on a GaAs substrate, from materials that do not lattice match with GaAs. It was learned that in these cases, the crystal membrane quality deteriorated, thereby causing it to be difficult to obtain a desired element life. For example, consider a case in which InGaAs, which has less In than InGaAs that forms the active layer, is employed to form the window region layer. In this case, the InGaAs does not lattice match with the GaAs substrate. Therefore, an InGaAs layer having favorable crystal membrane quality cannot be formed, thereby causing it to be difficult to obtain a desired element life.

InGaAsP is a material that lattice matches with the GaAs substrate, and has a greater energy gap than the InGaAs active layer. However, it was learned in experiments that if such quaternary semiconductor materials are employed as the material for a layer, such as a window region layer, which is stacked on various crystal surfaces, the ratio of the four materials becomes unbalanced, deteriorating the crystal membrane quality. In addition, if the crystal is grown at atmospheric temperatures less than or equal to 650° C., hillocks are generated and crystal membrane quality deteriorates, thereby decreasing the reliability of the element.

The super luminescent diode of the present invention comprises: the GaAs substrate having a first conductivity; the optical waveguide path constituted by one of the InGaAs active layer and the GaInNAs active layer that emits light having a central wavelength within a range of 0.95 μm to 1.2 μm, formed on the GaAs substrate; and the window region layer having a greater energy gap and a smaller refractive index than the active layer and a second conductivity different from the first conductivity, constituted by a binary or ternary semiconductor material with a lattice coefficient that lattice matches with GaAs within a range of ±0.1% and does not contain Al, provided at the rear emitting facet of the optical waveguide path. Therefore, a window region layer having a favorable crystal membrane can be realized. Accordingly, a super luminescent diode capable of emitting super luminescent light having an undistorted beam cross section, having a long element life can be provided.

The method for manufacturing super luminescent diodes of the present invention comprises: forming an optical waveguide path constituted by one of an InGaAs active layer and a GaInNAs active layer that emits light having a central wavelength within a range of 0.95 μm to 1.2 μm, on a GaAs substrate having a first conductivity; and forming a window region layer having a greater energy gap and a smaller refractive index than the active layer and a second conductivity different from the first conductivity, constituted by a binary or ternary semiconductor material with a lattice coefficient that lattice matches with GaAs within a range of ±0.1% and does not contain Al, at a rear emitting facet of the optical waveguide path, wherein: the manufacturing step following the formation of the active layer constituted by one of InGaAs and GaInNAs is performed in an environment at a temperature less than or equal to 650° C. Therefore, a window region layer having a favorable crystal membrane can be realized, without deterioration of the InGaAs or GaInNAs active layer. Accordingly, a superluminescent diode capable of emitting super luminescent light having an undistorted beam cross section, having a long element life can be manufactured.

BEST MODE FOR CARRYING OUT THE INVENTION

Hereinbelow, specific embodiments of the present invention will be described with reference to the attached drawings. First, a super luminescent diode 11 having an SBR (Selective Buried Ridge) structure will be described as a first embodiment of the present invention, with reference to FIGS. 1 through 3.

Figure 1:
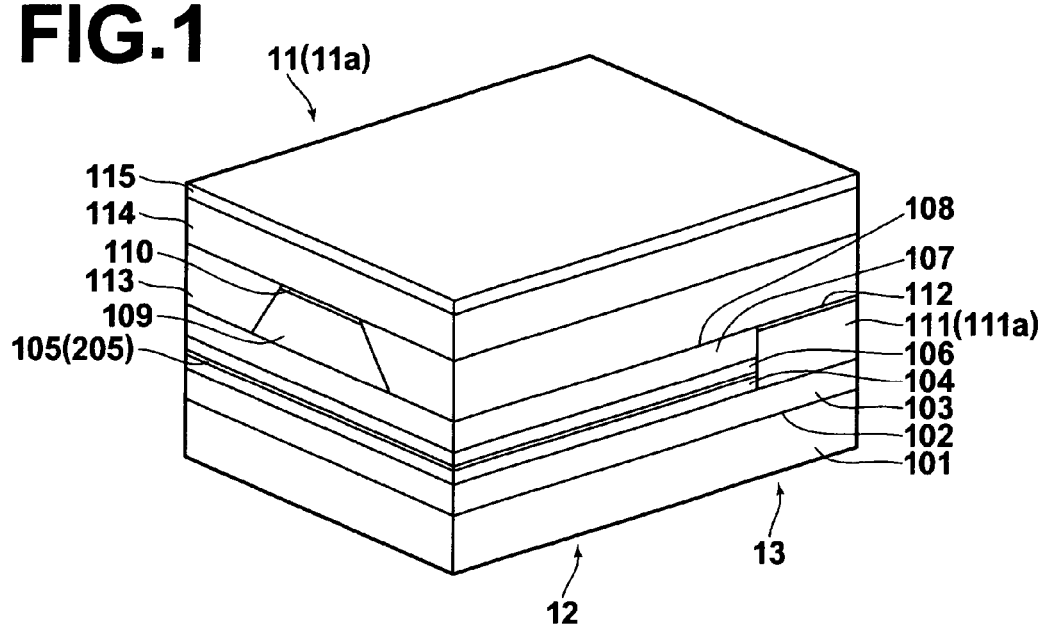
FIG. 1 is a perspective view that illustrates the layer structure of a super luminescent diode according to a first embodiment of the present invention.
Figure 2A:
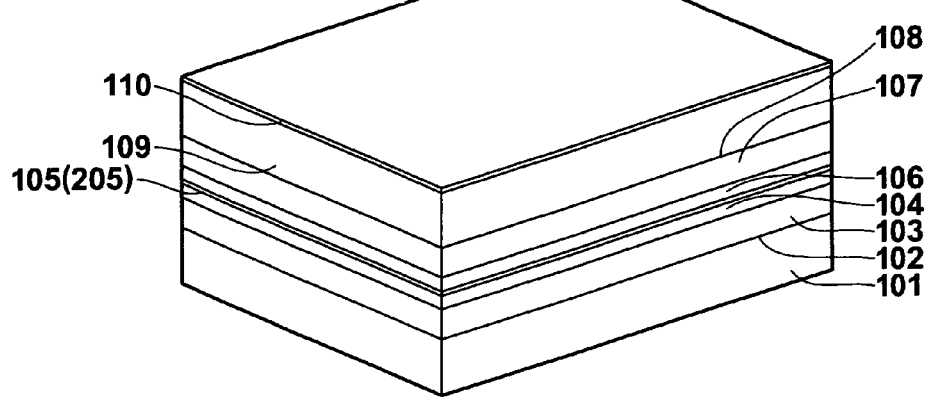
FIGS. 2A, 2B, and 2C are diagrams for explaining the manufacturing steps of the super luminescent diode according to the first embodiment.
Figure 2B:
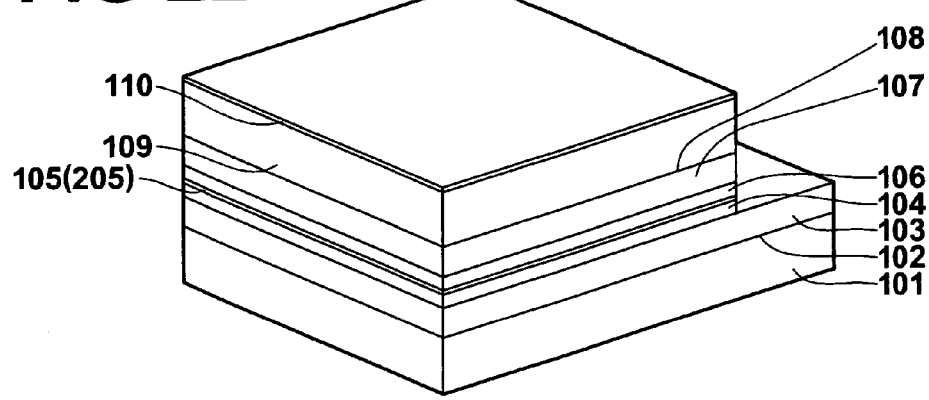

FIG. 1 is a perspective view that illustrates the layer structure of the super luminescent diode 11. The super luminescent diode 11 has an SBR structure, and is generated by the MOCVD (Metal Organic Chemical Vapor Deposition) method. TEG (Tri Ethyl Gallium), TMA (Tri Methyl Aluminum), TMI (Tri Methyl Indium), $AsH_3$ (arsine), $PH_3$ (phosphine) or the like are employed as the source gas in the MOCVD method. $SiH_4$ (silane), DEZ (Di Ethyl Zinc) or the like are employed as dopants.

As illustrated in FIG. 1, the super luminescent diode 11 is constituted by an optical waveguide portion 12 and a window portion 13, provided on the side of the optical waveguide portion 12 opposite the light emitting end thereof. The optical waveguide portion is of an SBR structure, wherein a ridge shaped p-type $In_{0.49}Ga_{0.51}P$ cladding layer 109, which is formed on a p-type GaAs etching stop layer 108, functions as a light guide.

The super luminescent diode 11 is constituted by: an n-type GaAs substrate 101, on which an n-type GaAs buffer layer 102 and an n-type $In_{0.49}Ga_{0.51}P$ cladding layer 103 are stacked in this order. The optical waveguide path section 12 is formed by: a non-doped GaAs lower optical guiding layer 104; an InGaAs multiple quantum well active layer 105; a non-doped GaAs upper optical guiding layer 106; a p-type $In_{0.49}Ga_{0.51}P$ first upper cladding layer 107, and the GaAs etching stop layer 108, which are stacked on the lower cladding layer 103 in this order. Note that an $In_xGa_{1-x}As$ composition having a ratio In:X>0.3 is employed as the material of the InGaAs multiple quantum well active layer 105.

The ridge-shaped p-type $In_{0.49}Ga_{0.51}P$ second upper cladding layer 109 is formed on the p-type GaAs etching stop layer 108. An n-$In_{0.49}(Al_{0.12}Ga_{0.88})_{0.51}P$ current blocking layer 113 is formed on the sides of the ridge (the p-type $In_{0.49}Ga_{0.51}P$ second upper cladding layer 109). A p-type GaAs cap layer 110 (thickness: 0.1 μm thick, carrier concentration: $7.0\times10^{17}$ cm$^{-3}$); a p-type $In_{0.49}(Al_{0.12}Ga_{0.88})_{0.51}P$ third upper cladding layer 114; and a p-GaAs contact layer 115 are formed on the upper surfaces of the ridge and the n-$In_{0.49}(Al_{0.12}Ga_{0.88})_{0.51}P$ current blocking layer 113.

The window section 13 is formed by a p-type GaAs window region layer 111; an $In_{0.49}Ga_{0.51}P$ window region layer etching stop layer 112; the n-$In_{0.49}(Al_{0.12}Ga_{0.88})_{0.51}P$ current blocking layer 113; the p-type $In_{0.49}(Al_{0.12}Ga_{0.88})_{0.51}P$ third upper cladding layer 114; and the p-GaAs contact layer 115, which are stacked in this order on the n-type $In_{0.49}Ga_{0.51}P$ lower cladding layer.

In the super luminescent diode 11 having the construction described above, light, which is guided through the InGaAs multiple quantum well active layer 105 toward the window section 13, is emitted within the window region layer 111 and scattered. Thereby, laser oscillation is suppressed, and a super luminescent light beam having a wide full width at half maximum spectrum is emitted from the light emitting end. The super luminescent diode 11 emits a 30 mW super luminescent light beam having a central wavelength of 1.1 μm and a full width at half maximum spectrum of 55 nm.

Next, a specific method for manufacturing the super luminescent diode 11 will be described with reference to FIGS. 2A through 3C. The n-type GaAs buffer layer 102 (thickness: 0.05 μm; carrier concentration: $7.0\times10^{17}$ cm$^{-3}$) and the n-type $In_{0.49}Ga_{0.51}P$ cladding layer 103 (thickness: 2.0 μm; carrier concentration: $7.0\times10^{17}$ cm$^{-3}$) are formed on the n-type GaAs substrate 101 by the MOCVD method, with a growth temperature of 685° C. and a growth atmospheric pressure of 10.3 kPa. Thereafter, the growth temperature is decreased to 600° C., and the non-doped GaAs lower optical guiding layer 104 (thickness: 0.034 μm); the high In composition InGaAs multiple quantum well active layer 105; the non-doped GaAs upper optical guiding layer 106 (thickness: 0.034 μm); the p-type $In_{0.49}Ga_{0.51}P$ first upper cladding layer 107 (thickness: 0.2 μm, carrier concentration: $7.0\times10^{17}$ cm$^{-3}$), the GaAs etching stop layer 108 (thickness: 10 nm, carrier concentration: $7.0\times10^{17}$ cm$^{-3}$), the ridge-shaped p-type $In_{0.49}Ga_{0.51}P$ second upper cladding layer 109 (thickness: 0.5 μm, carrier concentration: $7.0\times10^{17}$ cm$^{-3}$), and the p-type GaAs cap layer 110 (thickness: 0.1 μm, carrier concentration: $7.0\times10^{17}$ cm$^{-3}$) are formed in this order by a single growth process (refer to FIG. 2A).

Thereafter, an $SiO_2$ film that functions as a dielectric mask for selective growth is formed on the p-type GaAs cap layer 110 at the portion at which the optical waveguide path 12 is to be formed. The $SiO_2$ film is used as a mask, while etching away the InGaAs active layer 105 and the non-doped GaAs lower light guiding layer 104, to generate space in which the window region layer is to be formed (refer to FIG. 2B).

Figure 2C:
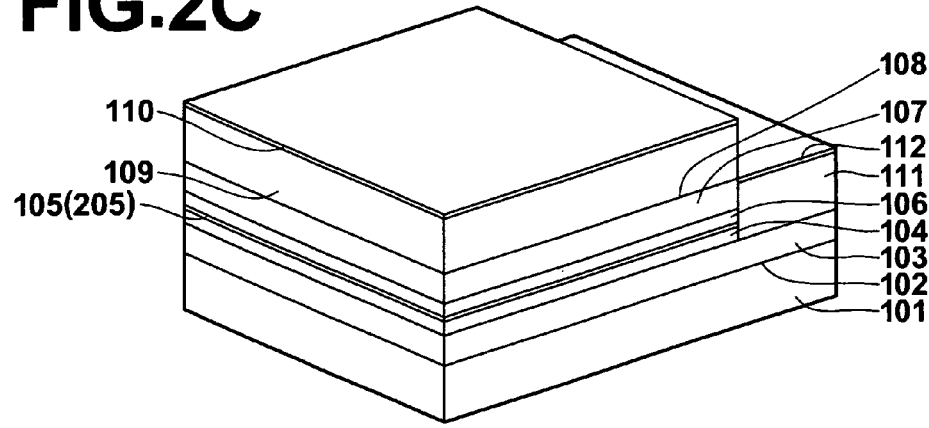
Figure 3A:
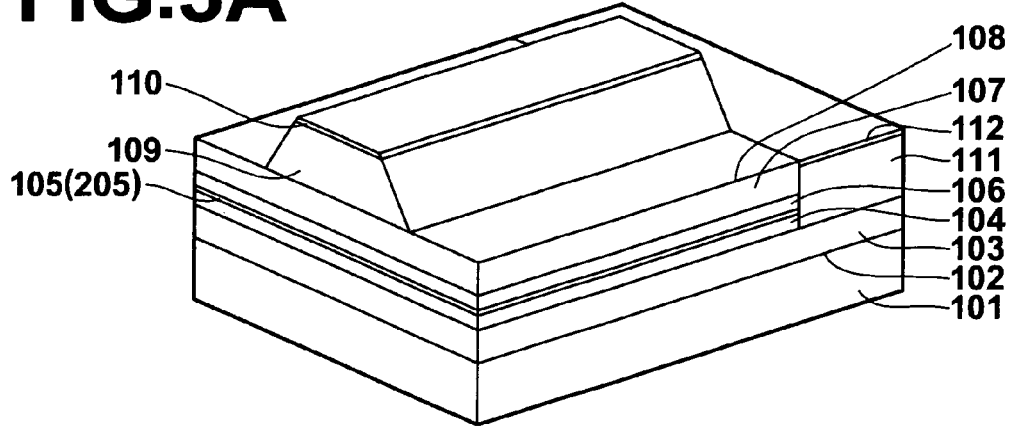
FIGS. 3A, 3B, and 3C are diagrams for explaining the manufacturing steps of the super luminescent diode according to the first embodiment.
Figure 3B:
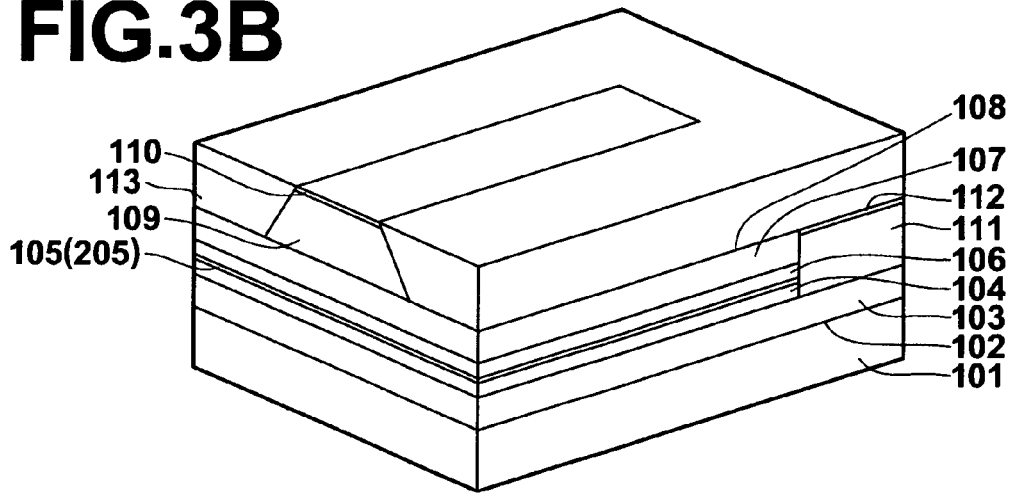
Figure 3C:
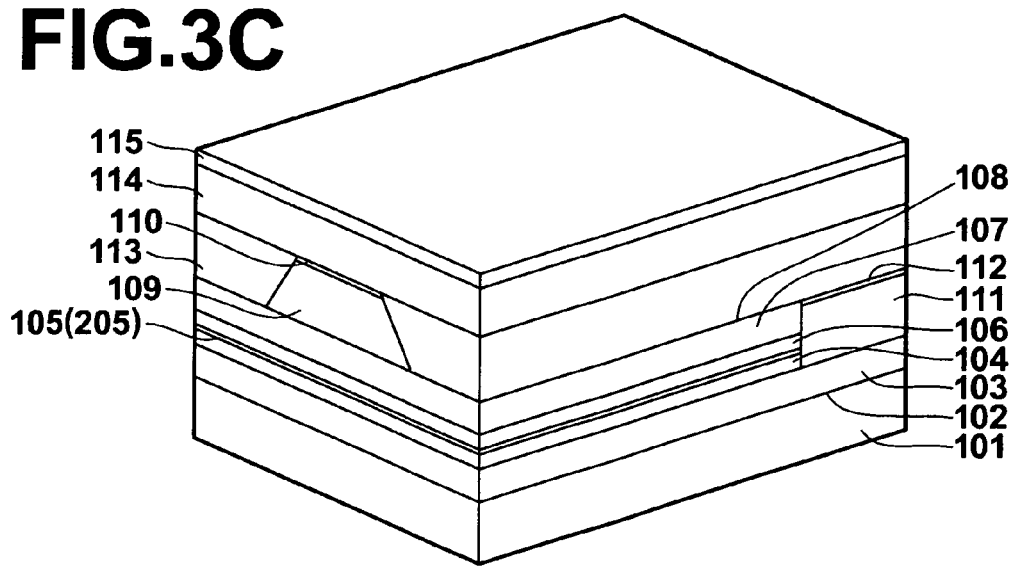

Next, the p-type GaAs window region layer 111 (thickness: 0.3 μm) and the $In_{0.49}Ga_{0.51}P$ window region layer etching stop layer 112 (thickness: 20 nm) are formed by the selective growth MOCVD method at a portion where the $SiO_2$ film is not formed, that is, a portion which is to become the window portion 13, with a growth temperature of 600° C. in a second crystal growth process (refer to FIG. 2C).

After the p-type GaAs window region layer 111 and the $In_{0.49}Ga_{0.51}P$ window region layer etching stop layer 112 are formed, an $SiO_2$ film that functions as a dielectric mask for selective growth is formed as a stripe. The $SiO_2$ film is used as a mask, while etching away the p-type GaAs cap layer 110 and the $In_{0.49}Ga_{0.51}P$ second upper cladding layer 109 so as to form a mesa stripe shaped ridge having a width of 3 μm at the lower end thereof (refer to FIG. 3A). Thereafter, the n-$In_{0.49}(Al_{0.12}Ga_{0.88})_{0.51}P$ current blocking layer 113 is formed by the selective growth MOCVD method on the p-type GaAs etching stop layer 108 and the p-type GaAs window region layer 111 where the $SiO_2$ dielectric film is not formed, with a growth temperature of 600° C. in a third crystal growth process (refer to FIG. 3B).

Further, the stripe shaped dielectric film is removed, and the p-type $In_{0.49}(Al_{0.12}Ga_{0.88})_{0.51}P$ third upper cladding layer 114 (thickness: 1.3 μm, carrier concentration: $7.0\times10^{17}$ cm$^{-3}$) and the p-GaAs contact layer 115 (thickness: 0.5 μm, carrier concentration: $7.0\times10^{19}$ cm$^{-3}$) are formed on the entire surface in a fourth crystal growth process at 600° C. (refer to FIG. 3C). Thereafter, the substrate is ground until the thickness of the entire super luminescent diode bar becomes approximately 100 μm, an n-side electrode is formed on the bottom surface of the substrate and a p-side electrode is formed on the contact layer by vapor deposition and a heating process. Next, the super luminescent diode bar is cleaved such that the length of the optical waveguide path is 0.7 mm and the window region layer is 0.5 mm. Finally, an AR film (having reflectance of 0.5% or less with respect to wavelengths of light emitted from the element itself) is coated on the optical waveguide surface, to form a super luminescent diode chip. The pn coupling portion, where the light emitting portion of the super luminescent diode chip is, is mounted on a heat sink in order to improve heat dissipating properties, to form the super luminescent diode element.

When the super luminescent diode 11 manufactured in this manner was caused to emit light, the emitted super luminescent light beam had a central wavelength of 1.1 μm and a full width at half maximum spectrum of 55 nm at an output of 30 mW. The super luminescent diode 11 was driven continuously at room temperature to evaluate the element life thereof. The output was reduced to 90% of initial output after approximately 6000 hours.

Super luminescent diodes were also manufactured with window region layers made of $In_{0.15}Ga_{0.85}As$, $In_{0.1}Ga_{0.9}As$, $Al_{0.05}Ga_{0.95}As$, and $Al_{0.1}Ga_{0.9}As$, respectively. Of these super luminescent diodes, the output of that having $Al_{0.05}Ga_{0.95}As$, which has the longest life of the aforementioned materials, was reduced to 90% after approximately 2000 hours of continuous driving.

As is clear from the description above, in the super luminescent diode 11 having the SBR structure according to the first embodiment of the present invention, the window region layer 111 is formed by p-type GaAs having a greater energy gap and a smaller refractive index than the InGaAs multiple quantum well active layer 105 and which has a lattice constant that lattice matches with the lattice constant of GaAs within a range of ±0.1% and does not contain Al. Therefore, the window region layer 111 having a favorable crystal membrane with the InGaAs active layer, which does not deteriorate, is realized. Accordingly, the super luminescent diode 11 is capable of emitting high output super luminescent light having an undistorted beam cross section, with a long element life.

The super luminescent diode 11 is also not exposed to temperatures that exceed 650° C. after the InGaAs multiple quantum well active layer 105 is formed. Therefore, the InGaAs multiple quantum well active layer 105 does not deteriorate, and as a result, high output can be maintained for a long period of time.

The present inventor also manufactured a super luminescent diode 11a, in which the window region layer 111 was formed by p-type $In_{0.49}Ga_{0.51}P$ instead of p-type GaAs. p-type $In_{0.49}Ga_{0.51}P$ is also a semiconductor material which has a greater energy gap and a smaller refractive index than the InGaAs multiple quantum well active layer 105 and has a lattice constant that lattice matches with the lattice constant GaAs within a range of ±0.1% and does not contain Al. When the super luminescent diode 11a was caused to emit light, the emitted super luminescent light beam had a central wavelength of 1.102 μm and a full width at half maximum spectrum of 55 nm at an output of 30 mW. The super luminescent diode 11a was driven continuously at room temperature to evaluate the element life thereof. The output was reduced to 90% of initial output after approximately 5000 hours.

Note that the InGaAs multiple quantum well active layer 105 was employed as the multiple quantum well active layer. Alternatively, a GaInNAs multiple quantum well active layer 205 may be employed instead of the InGaAs multiple quantum well active layer. A super luminescent diode having the GaInNAs multiple quantum well active layer, which has a well width of 5 nm, an In composition of 0.28 and an N composition of 0.05, was manufactured and caused to emit light. The emitted super luminescent light beam had a central wavelength of 1.102 μm and a full width at half maximum spectrum of 55 nm at an output of 30 mW. The super luminescent diode 11a was driven continuously at room temperature to evaluate the element life thereof. The output was reduced to 90% of initial output after approximately 16000 hours. A super luminescent diode that emits undistorted super luminescent light and which has an even longer element life can be realized, by employing the GaInNAs multiple quantum well active layer.

Figure 4:
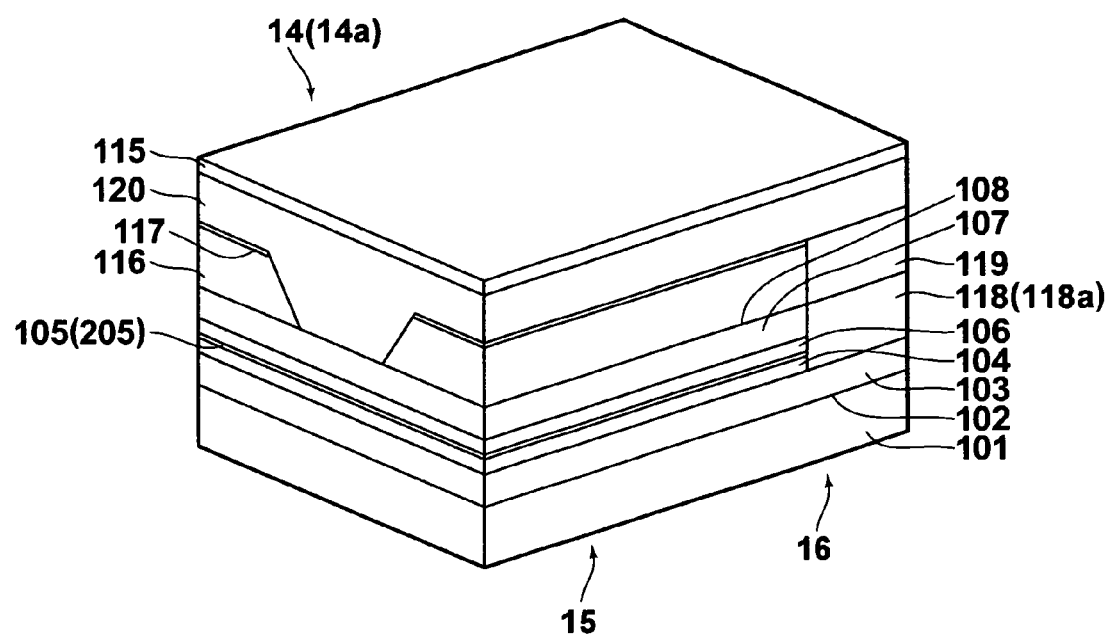
FIG. 4 is a perspective view that illustrates the layer structure of a super luminescent diode according to a second embodiment of the present invention.
Figure 5A:
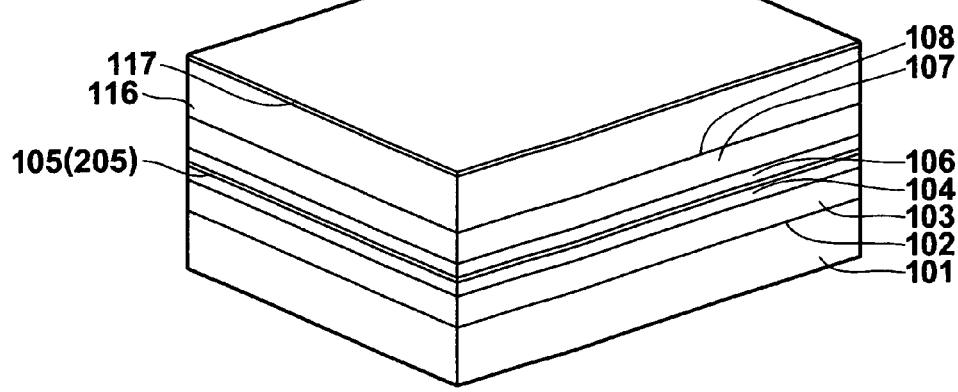
FIGS. 5A, 5B, and 5C are diagrams for explaining the manufacturing steps of the super luminescent diode according to the second embodiment.
Figure 5B:
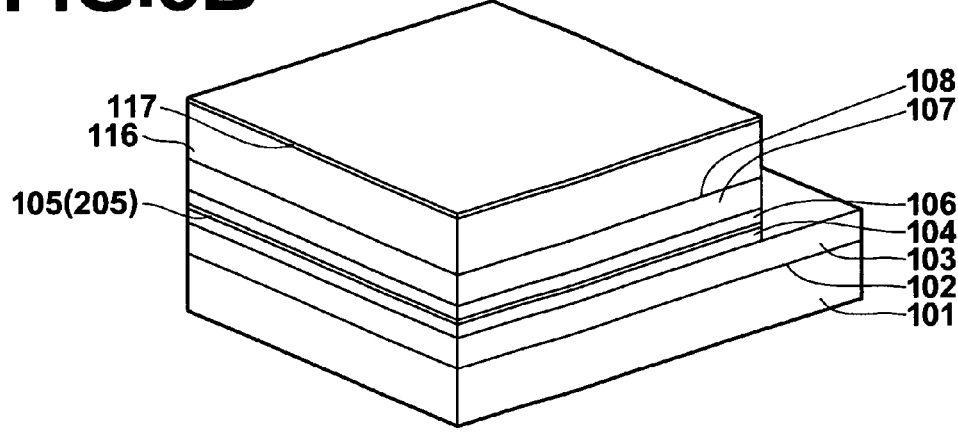
Figure 5C:
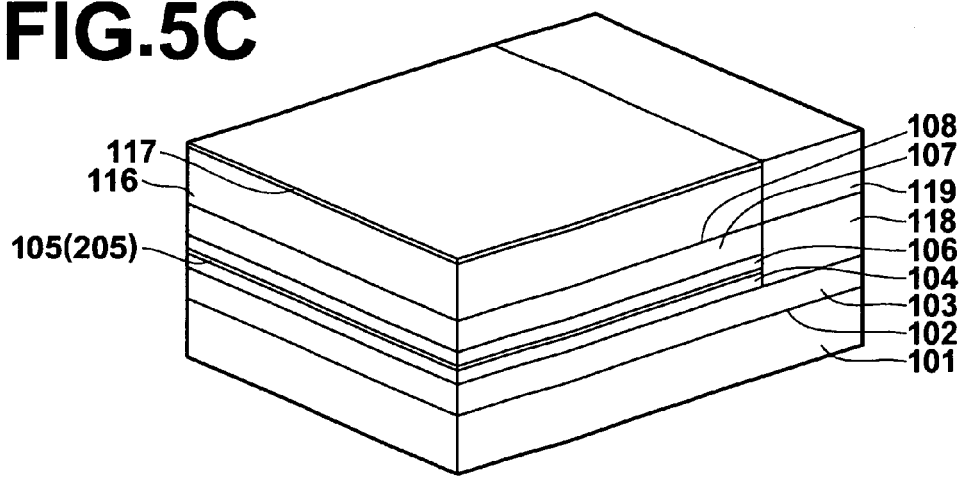
Figure 6A:
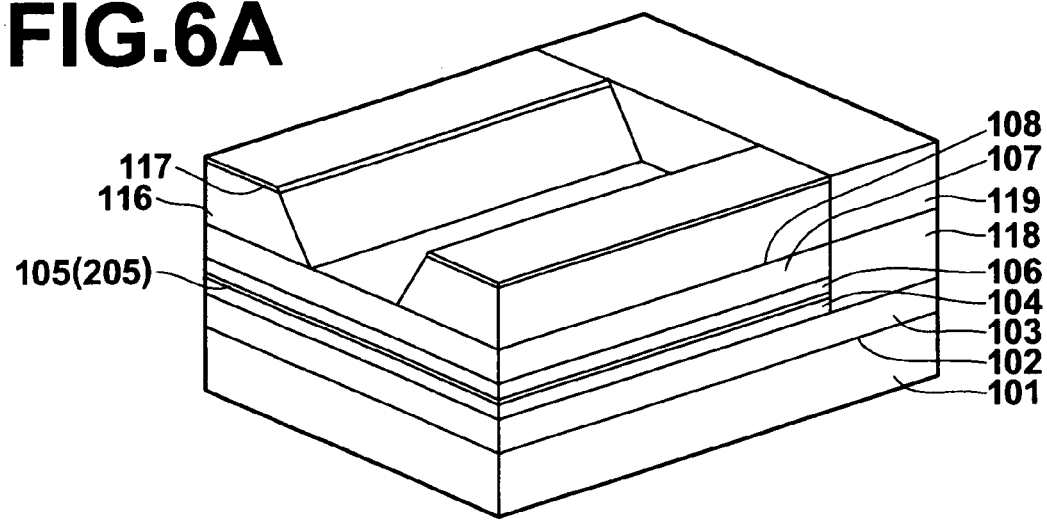
FIGS. 6A and 6B are diagrams for explaining the manufacturing steps of the super luminescent diode according to the second embodiment.
Figure 6B:
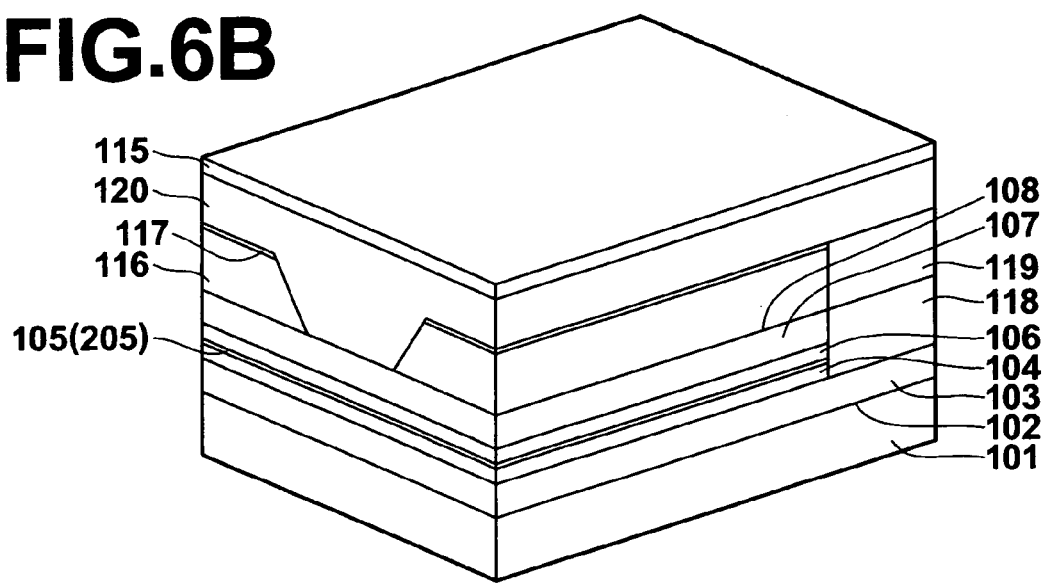

Next, a super luminescent diode 14 having an interior stripe structure will be described as a second embodiment of the present invention, with reference to FIGS. 4 through 6B. FIG. 4 is a perspective view that illustrates the layer structure of the super luminescent diode 14, which is manufactured by crystal growth using the MOCVD method. FIGS. 5 and 6 illustrate manufacturing steps.

As illustrated in FIG. 4, the super luminescent diode 14 is constituted by an optical waveguide portion 15 and a window portion 16, provided on the side of the optical waveguide portion 15 opposite the light emitting end thereof. The optical waveguide portion is of an inner stripe structure, wherein a 3 mm wide stripe, which is formed on a p-type GaAs etching stop layer 108, functions to constrict electric current.

Hereinafter, a specific method for manufacturing the super luminescent diode 14 will be described with reference to FIGS. 5A through 6C. An n-type GaAs buffer layer 102 (thickness: 0.05 μm; carrier concentration: $7.0 \times 10^{17}$ $cm^{-3}$) and an n-type $In_{0.49}Ga_{0.51}P$ lower cladding layer 103 (thickness: 2.0 μm; carrier concentration: $7.0 \times 10^{17}$ $cm^{-3}$) are formed on an n-type GaAs substrate 101 by the MOCVD method, with a growth temperature of 685° C. and a growth atmospheric pressure of 10.3 kPa. Thereafter, the growth temperature is decreased to 600° C., and a non-doped GaAs lower optical guiding layer 104 (thickness: 0.1 μm); an InGaAs multiple quantum well active layer 105 (for emitting 1.1 μm light); a non-doped GaAs upper optical guiding layer 106 (thickness: 0.1 μm); a p-type $In_{0.49}Ga_{0.51}P$ first upper cladding layer 107 (thickness: 0.2 μm, carrier concentration: $7.0 \times 10^{17}$ $cm^{-3}$), a p-type GaAs etching stop layer 108 (thickness: 10 nm, carrier concentration: $7.0 \times 10^{17}$ $cm^{-3}$), an n-type $In_{0.49}Ga_{0.51}P$ current blocking layer 116 (thickness: 0.5 μm, carrier concentration: $7.0 \times 10^{17}$ $cm^{-3}$), and a p-type GaAs cap layer 117 (thickness: 0.1 μm, carrier concentration: $7.0 \times 10^{17}$ $cm^{-3}$) are formed in this order in a first growth process (refer to FIG. 5A).

An $SiO_2$ dielectric film that functions as a dielectric mask for selective growth is formed on the p-type GaAs cap layer 117. The $SiO_2$ film is used as a mask, while etching away the InGaAs active layer 105 and the non-doped GaAs lower light guiding layer 104, to generate space in which the window region layer is to be formed (refer to FIG. 5B). Next, a p-type GaAs window region layer 118 (thickness: 0.3 μm) and an n-type $(Al_{0.33}Ga_{0.67})_{0.5}As$ current blocking layer 119 for the window region layer (thickness: 0.5 μm, carrier concentration: $7.0 \times 10^{17}$ $cm^{-3}$) are formed by the selective growth MOCVD method at a portion where the $SiO_2$ film is not formed, with a growth temperature of 600° C. in a second crystal growth process (refer to FIG. 5C). After the p-type GaAs window region layer 118 and the n-type $(Al_{0.33}Ga_{0.67})_{0.5}As$ current blocking layer for the window region layer are formed, an $SiO_2$ film that functions as a dielectric mask for selective growth is formed. The $SiO_2$ film is used as a mask, while etching away the p-type GaAs cap layer 117 and the n-type $In_{0.49}Ga_{0.51}P$ current blocking layer 116 so as to form an inner stripe having a width of 3 μm at the lower end thereof (refer to FIG. 6A). Thereafter, a p-type $(Al_{0.33}Ga_{0.67})_{0.5}As$ second upper cladding layer 120 (thickness: 1.7 μm, carrier concentration: $7.0 \times 10^{19}$ $cm^{-3}$) and a p-type GaAs contact layer 115 (thickness: 0.5 μm, carrier concentration: $7.0 \times 10^{19}$ $cm^{-3}$) are formed by the selective growth MOCVD method on the entire surface of the inner stripe and the window region layer 118, with a growth temperature of 600° C. in a third crystal growth process (refer to FIG. 6B). Thereafter, the substrate is ground until the thickness of the entire super luminescent diode bar becomes approximately 100 μm, an n-side electrode is formed on the bottom surface of the substrate and a p-side electrode is formed on the contact layer by vapor deposition and a heating process. Next, the super luminescent diode bar is cleaved such that the length of the optical waveguide path is 0.7 mm and the window region layer is 0.5 mm. Finally, an AR film (having reflectance of 0.5% or less with respect to wavelengths of light emitted from the element itself) is coated on the optical waveguide surface, to form the super luminescent diode 14. The pn coupling portion, where the light emitting portion of the super luminescent diode 14 is, is mounted on a heat sink in order to improve heat dissipating properties.

When the super luminescent diode 14 manufactured in this manner was caused to emit light, the emitted super luminescent light beam had a central wavelength of 1.095 μm and a full width at half maximum spectrum of 45 nm at an output of 30 mW. The super luminescent diode 14 was driven continuously at room temperature to evaluate the element life thereof. The output was reduced to 90% of initial output after approximately 4500 hours.

Super luminescent diodes were also manufactured with window region layers 118 made of $In_{0.15}Ga_{0.85}As$, $In_{0.1}Ga_{0.9}As$, $Al_{0.05}Ga_{0.95}As$, and $Al_{0.1}Ga_{0.9}As$, respectively. Of these super luminescent diodes, the output of that having $Al_{0.05}Ga_{0.95}As$, which has the longest life of the aforementioned materials, was reduced to 90% after approximately 1200 hours of continuous driving.

As is clear from the description above, in the super luminescent diode 14 having the inner stripe structure according to the second embodiment of the present invention, the window region layer 118 is formed by p-type GaAs having a greater energy gap and a smaller refractive index than the InGaAs multiple quantum well active layer 105 and which has a lattice constant that lattice matches with the lattice constant of GaAs within a range of ±0.1% and does not contain Al. Therefore, the window region layer 118 having a favorable crystal membrane with the InGaAs active layer 105, which does not deteriorate, is realized. Accordingly, the super luminescent diode 14 is capable of emitting high output super luminescent light having an undistorted beam cross section, with a long element life.

The super luminescent diode 14 is also not exposed to temperatures that exceed 650° C. after the InGaAs multiple quantum well active layer 105 is formed. Therefore, the InGaAs multiple quantum well active layer 105 does not deteriorate, and as a result, high output can be maintained for a long period of time.

The present inventor also manufactured a super luminescent diode 14*a*, in which a window region layer 118*a* was formed by p-type $In_{0.49}Ga_{0.51}P$ instead of p-type GaAs. p-type $In_{0.49}Ga_{0.51}P$ is also a semiconductor material which has a greater energy gap and a smaller refractive index than the InGaAs multiple quantum well active layer 105 and which has a lattice constant that lattice matches with the lattice constant GaAs within a range of ±0.1% and does not contain Al. When the super luminescent diode 14*a* was caused to emit light, the emitted super luminescent light beam had a wavelength of 1.092 µm and a full width at half maximum spectrum of 62 nm at an output of 30 mW. The super luminescent diode 14*a* was driven continuously at room temperature to evaluate the element life thereof. The output was reduced to 90% of initial output after approximately 4000 hours.

Note that a GaInNAs multiple quantum well active layer 205 may be employed instead of the InGaAs multiple quantum well active layer in the super luminescent diode 14 of the second embodiment as well. In this case, a super luminescent diode that emits undistorted super luminescent light and which has an even longer element life can be realized, by employing the GaInNAs multiple quantum well active layer.

Note that the inventor manufactured super luminescent diodes according to each of the aforementioned embodiments such that structures above the non-doped GaAs upper light guiding layer 106 (thickness: 0.1 µm) were grown at temperatures of 650° C., 630° C., 585° C., 550° C., 535° C., and 510° C., respectively. Favorable properties were obtained as long as GaAs or InGaP was employed as the material of the window region layer.

The super luminescent diode according to the first embodiment is of an SBR structure, and the super luminescent diode according to the second embodiment is of an inner stripe structure. However, the structure of super luminescent diodes is not limited to the above. The present invention may be applied to any super luminescent diode having a window structure, such as those of an index guide structure and those of a gain guide structure.

What is claimed is:

1. A super luminescent diode, comprising:
   a GaAs substrate having a first conductivity;
   an optical waveguide path constituted by an InGaAs active layer that emits light having a central wavelength within a range of 0.95 µm to 1.2 µm, formed on the GaAs substrate; and
   a window region layer having a greater energy gap and a smaller refractive index than the active layer and a second conductivity different from the first conductivity, constituted by a binary or ternary semiconductor material with a lattice coefficient that lattice matches with GaAs within a range of ±0.1% and does not contain Al, provided at a rear emitting facet of the optical waveguide path.

2. An optical tomography apparatus as defined in claim 1, wherein:
   the semiconductor material of the window region later is GaAs.

3. An optical tomography apparatus as defined in claim 1, wherein:
   the semiconductor material of the window region layer is InGaP.

4. A method for manufacturing a super luminescent diode, comprising:
   forming an optical waveguide path constituted by an InGaAs active layer that emits light having a central wavelength within a range of 0.95 µm to 1.2 µm, on a GaAs substrate having a fist conductivity; and
   forming a window region layer having a grater energy gap and a smaller refractive index than the active layer and a second conductivity different from the first conductivity, constituted by a binary or ternary semiconductor material with a lattice coefficient that lattice matches with GaAs within a range of ±0.1% and does not contain Al, at a rear emitting facet of the optical wavelength path, wherein:
   the manufacturing step following the formation of the active layer constituted by one of InGaAs and GaInNAs is performed in an environment at a temperature less than or equal to 650° C.

* * * * *